(12) United States Patent
Tatsuno et al.

(10) Patent No.: US 6,937,628 B2
(45) Date of Patent: Aug. 30, 2005

(54) OPTICAL TRANSMITTER MODULES

(75) Inventors: Kimio Tatsuno, Tokyo (JP); Katsumi Kuroguchi, Yokohama (JP); Atsuhiro Yamamoto, Yokohama (JP); Teruhisa Azumaguchi, Yokohama (JP); Hiroaki Furuichi, Yokohama (JP)

(73) Assignee: Opnext Japan, Inc., Kanagawa (JP)

( * ) Notice: Subject to any disclaimer, the term of this patent is extended or adjusted under 35 U.S.C. 154(b) by 168 days.

(21) Appl. No.: 10/087,784

(22) Filed: Mar. 5, 2002

(65) Prior Publication Data

US 2003/0067948 A1 Apr. 10, 2003

(30) Foreign Application Priority Data

Oct. 10, 2001 (JP) ........................................ 2001-312894

(51) Int. Cl.⁷ ................................................ H01S 3/10
(52) U.S. Cl. .............................. 372/19; 372/34; 372/98; 372/32; 372/23
(58) Field of Search ........................... 372/34, 98, 19.3, 372/2, 23, 32, 18, 20, 57; 359/247

(56) References Cited

U.S. PATENT DOCUMENTS

| | | | | |
|---|---|---|---|---|
| 5,798,859 A | * | 8/1998 | Colbourne et al. | ......... 359/247 |
| 6,526,079 B1 | * | 2/2003 | Watterson et al. | ............ 372/32 |
| 6,553,050 B1 | * | 4/2003 | Kleinschmidt et al. | ....... 372/57 |
| 2002/0080833 A1 | * | 6/2002 | Matsuura et al. | ............. 372/20 |
| 2002/0126386 A1 | * | 9/2002 | Jordan et al. | ............... 359/577 |

* cited by examiner

*Primary Examiner*—Leon Scott, Jr.
(74) *Attorney, Agent, or Firm*—Antonelli, Terry, Stout & Kraus, LLP

(57) ABSTRACT

A subject of the invention is to reduce the temperature dependence of an etalon as a wavelength locker for a semiconductor laser device and so forth. Concretely, it is to restrict the lowering of the wavelength locking performance of the etalon dependent on the temperature variation. A means to solve the subject is the use of an air gap etalon. Concretely, the means is provided with a media plate and parallel plane plates on both sides of the media plate. The two parallel plane plates and the space between them constitute the air gap etalon.

20 Claims, 10 Drawing Sheets

OPTICAL TRANSMITTER MODULES

BACKGROUND OF THE INVENTION

The present invention relates to an optical transmitter module and an optical communication system employing the same, specifically to a diode laser controlling module that has an etalon as the wavelength filtering device to stabilize the oscillating wavelength and an applied device and optical communication system using the same.

The optical fiber communication retains a high-speed large capacity over a long distance and a strong resistance against electromagnetic noises, which makes it possible to organize a communication system for assuring a high reliability. This system has been transmitting a light signal of one wavelength with one optical fiber. However, it has been requested to further expand the transmission capacity, accompanied with the recent incoming large-capacity information-oriented society. Accordingly, the technique on the wavelength division multiplexed optical communication system has been put to practical use, which transmits multiple light signals of different wavelengths with one optical fiber, and increases the number of communication channels to realize the large capacity. With regard to the wavelength of the light transmitted an optical fiber, the wavelength region of a low transmission loss in the optical fiber is used, and the 1.3 micron waveband and the 1.5 micron waveband are called the window of transmission. The wavelength breadths of these windows are limited. Wavelength spacing between adjacent channels has been narrowed as far as possible, whereby the number of transmission channels has been increased. At the present time, the frequency spacing is 200 GHz or 100 GHz; however, the tendency heads for 50 GHz, 25 GHz, and so forth. To convert them into the wavelength spacing, they are equivalent to about 1.6 nm, 0.8 nm, 0.4 nm, 0.2 nm, and 0.1 nm, respectively, which are being narrowed.

As the wavelength spacing becomes narrower as above, there arises a necessity to maintain the wavelengths of a laser source precisely uniformly. When the wavelength of a laser source wavers and reaches a wavelength of an adjacent channel, there appears crosstalk between adjacent channel signals on the receiver side, which cannot assure the reliability of information communications. This is the reason for the necessity. These wavelength (or, frequency) channels are named as the ITU-T (International Telecommunication Union-Telecommunication Standardization Sector) grid, which is widely recognized as the ITU recommendation (International Telecommunication Union Standard).

Against this backdrop, various methods have been proposed which control the wavelength of a laser source in the wavelength division multiplexed communication. For example, a newly devised method has been put forward which locks a wavelength by introducing the dielectric multi-layer film filter or the Fabry-Perot Etalon as the wavelength filtering device, and by feeding back the detected error to the operational temperature of a semiconductor laser. In particular, the etalon embraces the characteristics that transmission peaks appear repeatedly according to a multiple interference order. For this reason, it becomes possible to lock the wavelengths of plural wavelength channels with one wavelength filtering device by bringing the period of the transmission curve into coincidence with the ITU-T grid. For example, Japanese Patent Laid-open No. Hei 10-79723 discloses a method of dividing a light beam transmitted through the Etalon into two light beams, receiving both of the lights by a first and a second photo-detector, acquiring a wavelength error detection signal from a difference between both the received light signals, and locking the wavelength by using the wavelength error detection signal.

SUMMARY OF THE INVENTION

It is an object of the present invention to provide an optical transmitter module including a semiconductor laser that eliminates an influence on an etalon and so forth by ambient temperature and so forth as far as possible, and stabilizes the oscillation wavelength of the semiconductor laser.

The conventional etalon has a temperature dependency. In other words, the etalon has a characteristic that the temperature variation in the materials constituting the etalon varies the optical path length of the etalon, resulting from the temperature dependence of a reflective index and coefficient of linear expansion of the materials, whereby a wavelength of light transmitted through the etalon varies. Thus, the inventor has found a problem that there arises a shift between the wavelength desirably locked by using the etalon and the wavelength locked in the actual laser, caused by the change in ambient temperature.

This phenomenon appears as a wavelength shift, when the so-called tracking test is performed, that is, when the ambient temperature of a package incorporating a wavelength locker changes from 0° C. to 70° C. Furthermore, the semiconductor laser can vary the oscillating wavelength. To vary the wavelength needs to vary the temperature of the semiconductor laser. In this case, if the etalon has a temperature dependency, it will create a shift in the locked wavelength of the semiconductor laser device, which is a problem to be solved.

In view of these facts and circumstances, the principal point of the present invention is to reduce the influence caused by the temperature dependence that the etalon holds. Furthermore, the other aspect of the invention is to reduce the number of components relating to a wavelength locking optical system, and to increase the degree of integration relating to the foregoing optical system.

The essence of a first aspect according to the present invention is as follows: the essence lies in the structural characteristic of an etalon as a wavelength error detection device. The etalon includes two sheets of plate materials such as polished glass, and a media plate for holding the two plate materials. The two plate materials are fixed to the media plate in such a manner that they are held in parallel and a specific spacing between them is held. The coefficient of thermal expansion of the media plate needs to be sufficiently low. The media plate thermally stretches depending upon the temperature of itself, and the spacing between the two plate materials varies accordingly, which leads to an error factor of the etalon as a detection device. This error factor should be as low as possible. The two plate materials and a gas (for example, air) that fills the gap between the two plate materials constitute the Fabry-Perot Etalon that functions as the wavelength error detection device. According to the embodiments of this invention, it is possible to configure an optical communication apparatus, and optical installations and systems that require sufficiently stabilized oscillating wavelengths.

The embodiment according to the invention is characterized in that the wavelength error detection device provided with a structure different from that of the conventional solid etalon reduces the temperature dependence of the transmission curve of the wavelength. The plate materials fixed to the media plate are formed into a structure such as a cantilever or an inboard beam. For example, portions near one ends of the plate materials are fixed to the media plate, and the other portions are made to extend outward from the media plate. Alternatively, portions near the centers of the plate materials are fixed to the media plate, and the other portions except for the centers are made to extend outward from the media plate. Alternatively, two media plates are prepared, and both the ends of the plate materials are fixed to each of the media plates. In this case, a region composed of the portions near the centers of the plate materials is served as multiple reflection regions of the laser beams.

The paired plates are made of a material that transmits the laser beams, and the surfaces, opposed to each other, of the paired plated are polished to attain a high flatness. In addition, on the surfaces opposed to each other are formed reflection membranes, whereby desired transmission curves can be obtained in accordance with the variations in the laser wavelengths. The media plate adopts a material whose coefficient of thermal expansion is lower than the coefficient of thermal expansion ($0.5 \times 10^{-6}/°$ C.) of the quartz glass that is used for the material of the conventional solid etalon. The lower the coefficient of thermal expansion of the media plate is adopted, the better the result can be achieved. Concretely, the coefficient of thermal expansion is selected in view of the wavelength multiplicity of the optical fiber communication; that is, it is selected to such a degree that the crosstalk determined by the gaps between channels can be reduced sufficiently low.

The essence of a second aspect according to the invention lies in a means that branches outgoing beams from a semiconductor laser source, by using a part of a groove on a silicon substrate that mounts at least a semiconductor laser and a condensing lens.

The laser source is mounted on a silicon substrate. The silicon substrate has a tilted surface that is slant against the optical axis of the laser beams. This tilted surface has an inclination that reflects the laser beams in a direction such that a reflected light from this tilted surface intersects the optical axis of the laser beams. The silicon substrate usually mounts at least the laser source and the condensing lens as well. Part of the laser beams that passes through the condensing lens fall on the tilted surface. The other laser beams directly advance without falling on the tilted surface. The laser beams are split into an incident light onto the tilted surface and a directly progressive light. The reflected light is guided to a first photo-detector, and the progressive light is guided to the etalon. The tilted surface on the silicon substrate is formed by means of the anisotropic etching against the crystallinity of the silicon substrate, which is practical and highly accurate.

According to the embodiments of the invention, it is possible to reduce the number of components of the optical communication apparatus, and various optical installations and optical systems that require the stabilization of the oscillating wavelengths. Also, it is possible to shrink the size of these apparatuses.

BRIEF DESCRIPTION OF THE DRAWINGS

Preferred embodiments of the present invention will be described in detail based on the followings, wherein.

DESCRIPTION OF THE PREFERRED EMBODIMENTS

Description of a Basic Control Loop for Locking a Wavelength

Figure 1:
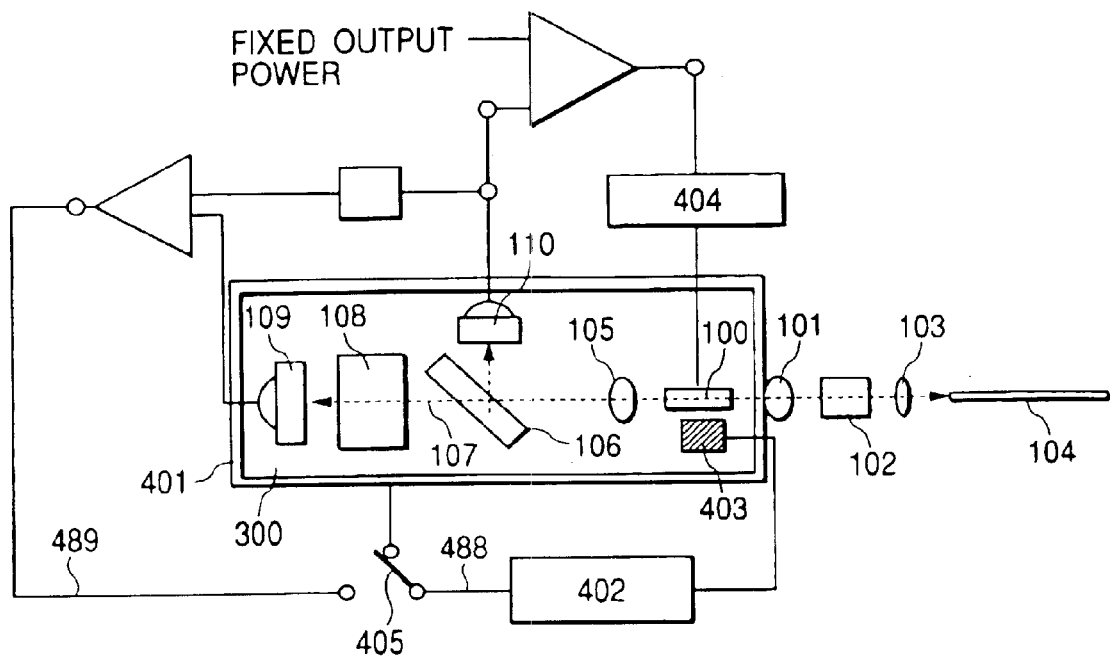
FIG. 1 is a structural diagram of a wavelength-controlling loop.
Figure 2:
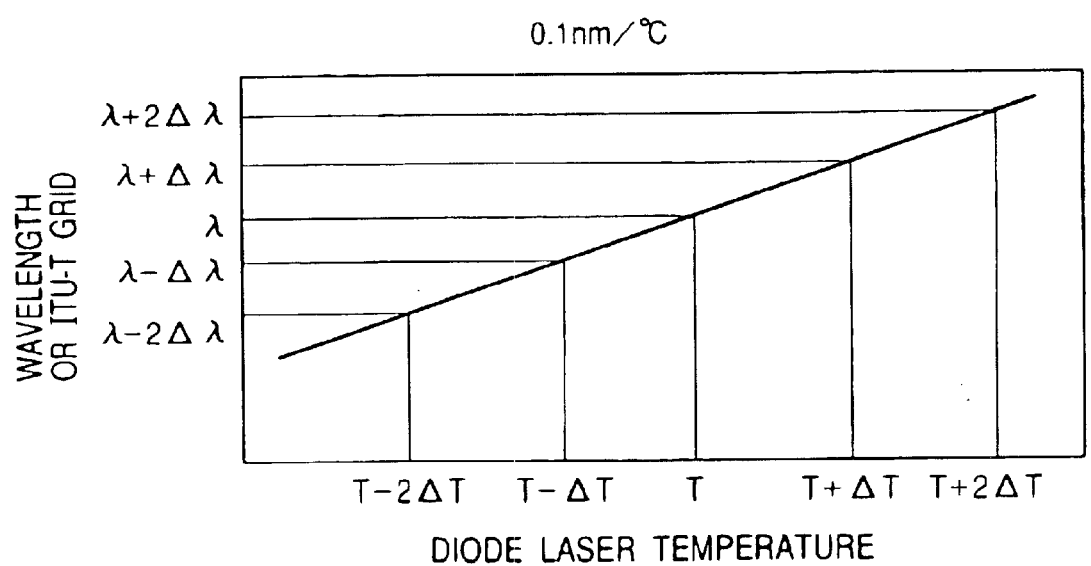
FIG. 2 is a diagram illustrating the relation between the oscillating wavelength of a semiconductor laser and the temperature.

FIG. 1 illustrates a basic control loop for locking a wavelength according to the present invention. A variable wavelength laser source 100 employs a DFB (Distributed Feed Back) type, or Fabry-Perot type semiconductor laser. Or, the laser source is one in which a field absorption type modulator is integrated into the DFB type semiconductor laser. Such variable wavelength laser source 100 has characteristics, as shown in FIG. 2, in which an oscillating wavelength λ varies with an operation temperature T. Therefore, it is possible to select a wavelength corresponding to an ITU-T grid by the operation temperature. FIG. 2 illustrates the relation between the temperature and the oscillating wavelength of the semiconductor laser. The horizontal axis represents the temperature, and the vertical axis the oscillating wavelength. This oscillating wavelength can be brought into correspondence with the ITU-T grid. From this viewpoint, the vertical axis in FIG. 2 indicates the ITU-T grid as well.

A description will be made with reference to FIG. 1. In the figure, the variable wavelength laser source 100, a condensing lens 105, a beam splitter 106, a photo-detector 110, an etalon 108, a photo-detector 109, a thermistor 403, and so forth are mounted on a thermo-electric cooler 401. The thermo-electric cooler 401 underlies a stem 300. This will be explained with reference to FIG. 6. A drive circuit 402 of the thermo-electric cooler 401 is able to maintain the temperature of the laser source 100 at a temperature corresponding to the resistance of the thermistor 403. This controls the temperature of the semiconductor laser.

On the other hand, a collimator 101 collimates the forward outgoing beams emitted from the variable wavelength laser source 100, and the collimated beams pass through an optical isolator 102 and a focusing lens 103 to be coupled to an optical fiber 104 for information transmission.

A temperature control loop 488 is made up, when a switch 405 is switched to the upper side in FIG. 1. In contrast to this, the wavelength control loop is made up, when the switch 405 is switched from the temperature control loop 488 side to a wavelength control loop 489 side. First, the collimator 105 collimates the backward outgoing beams from the variable wavelength laser source 100, and the beam splitter 106 splits the collimated beams into transmission light 107 and reflected light. The beam splitter 106 is made up of laminating triangular prisms, or if the adhesive is not preferred, it is made up with a dielectric thin film applied to a thin plane parallel plate. The photo-detector 110 photo-electrically transforms the reflected light into an output monitor of the laser source 100. Then, the output monitor of the laser source 100 is compared with a preset light output, and a drive circuit 404 maintains the output power of the laser source at a constant value.

An optical system for wavelength error detection according to an embodiment of the present invention is configured as follows. That is, the transmission light 107 further advances to the etalon 108, the light that is multiple-reflected inside the etalon 108 interferes each other, and in consequence the transmission peak given by the expression (1) is produced.

$$It=1/(1+F \sin^2(\phi)) \quad (1)$$

Where, $$F=4R/(1-R)^2 \quad (2)$$

$$\phi=(2\pi nt/\lambda)\cos \theta' \quad (3)$$

Figure 3:
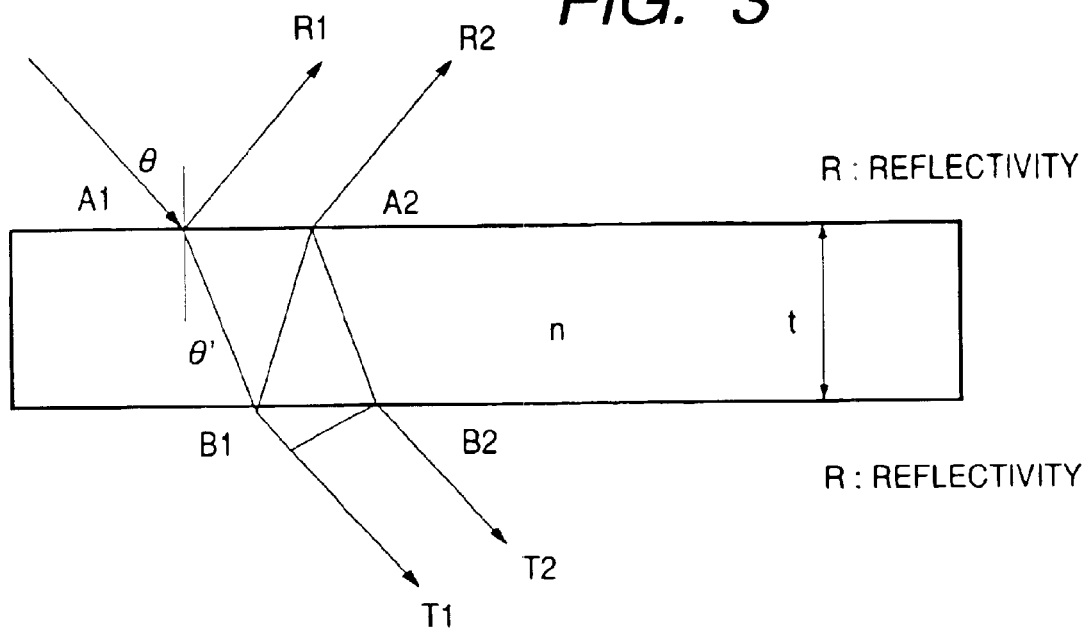
FIG. 3 is a sectional view illustrating the principle of operation of the etalon.

Where, R represents the film reflection factor of each face of the etalon 108, n the refraction factor of the etalon, t the thickness of the etalon, λ the wavelength of light, and θ' the angle formed by the light inside the etalon. These relations are illustrated in FIG. 3.

Here, the Snell's Law is met.

$$\sin \theta = \sin \theta' \quad (4)$$

Furthermore, the repeated peak interval of the transmission light is called the Free Spectral Range (FSR). This is given by the following expressions (5) and (6), in the wavelength domain and the frequency domain, respectively.

$$FSR=\lambda^2/2nt \quad (5)$$

$$FSR=c/2nt \quad (6)$$

where, c represents the velocity of light. Therefore, Designing the thickness t, refraction factor n, film reflection factor R of the etalon will bring the FSR into coincidence with the spacing of the ITU-T grid. Bringing the FSR into coincidence with the ITU-T grid makes it possible to realize the wavelength error detection having desired sharp wavelength selection characteristics over a wide wavelength range. Thus, it is possible to possess plural transmission ranges of light in a desired wavelength that exists with specific wavelength spacing, and to bring any of the plural transmission ranges of the light into correspondence with the desired oscillating wavelength of the laser source.

The transmission peaks arise repeatedly with variations in wavelength shift, and the spacing of the repetition is called the Free Spectral Range (FSR), as mentioned above, which is expressed by (5) or (6).

Figure 9:
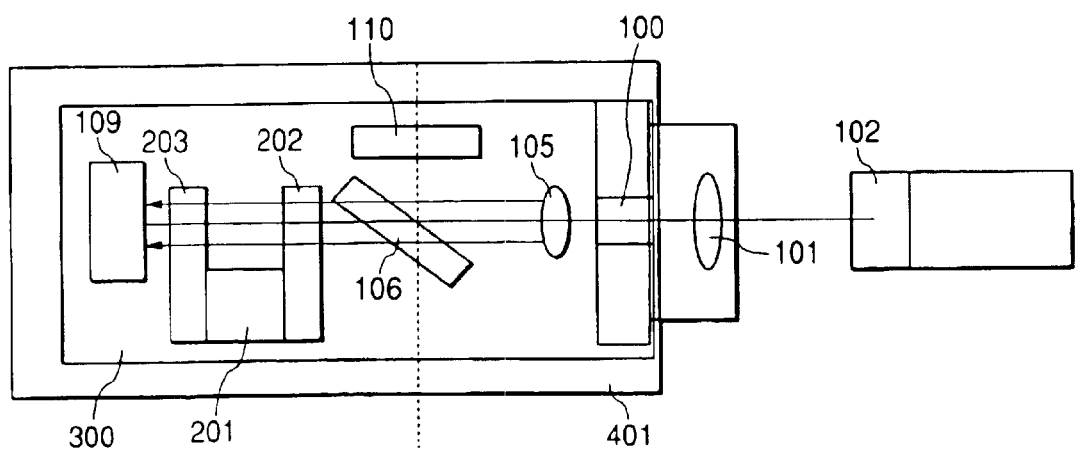
FIG. 9 is a plan view illustrating the configuration of the optical system for locking a wavelength according to the present invention.

The photo-detector 109 in FIG. 9 receives the transmission light of the etalon thus attained, and transfers the light into a photocurrent. On the other hand, the photo-detector 110 receives the reflected light on the beam splitter 106, and transfers the light into a photocurrent. The objective wavelength error detection signal is given by the following expression (7).

$$A(\lambda)=Pt-Pm \quad (7)$$

Here, Pm represents the photocurrent that flows through the photo-detector 110 for monitoring the output of the light power. In addition, Pt represents the photocurrent given by the foregoing expression (1). In other words, Pt signifies the photocurrent converted from the light signal by the photo-detector 109 for monitoring the wavelength placed after the etalon 108. A(λ) represents a difference signal between Pt and Pm, which is an error signal.

Incidentally, as the error signal, a signal normalized by the amount of light:

$$A(\lambda)=(Pt-Pm)/(Pt+Pm) \quad (8)$$

may be appropriately used.

Thus, the wavelength control loop carries out the feedback to the drive circuit 402 for the thermo-electric cooler 401 of the semiconductor laser 100 illustrated in FIG. 1, in such a manner that the acquired wavelength error detection signal A(λ) having a high sensitivity becomes zero, or a constant value. In order that the error signal given by the expression (7) or (8) captures the vicinity of one wavelength corresponding to the desired ITU-T grid, it is necessary to read the temperature of the semiconductor laser in advance from the value of the thermistor 403, and to set the operation temperature to the vicinity from the relation between the temperature and the wavelength acquired according to FIG. 2. Thereafter, the switch 405 is switched into the wavelength lock loop. On the other hand, an Automatic Power Control (APC) compares the output from the photo-detector 110 with a set value, and feeds back the difference obtained by the comparison to the drive circuit 404 of the laser source 100 so as to maintain the output power from the semiconductor laser at a constant level. The foregoing is the basic explanation of the control loop for locking the wavelength.

Examination on the Background of the Present Invention

A ratio between ε being a half-value breadth of the transmission peak of the etalon and the FSR is called finesse Φ, which has the relation of the following expressions (9), (10), (11) with the reflection factor R of the etalon.

$$F=4R/(1-R)^2 \quad (9)$$

$$\Phi=(\lambda\sqrt{F})/2 \quad (10)$$

$$\Phi=FSR/\epsilon \quad (11)$$

Therefore, in order to acquire a sharp spectral characteristic of the etalon, namely, a low value of ε, it is necessary to have a higher reflection factor on both the sides of the etalon, and to generate multiple reflections repeatedly on both the sides. Accordingly, the angle of incident light to the etalon should be perpendicular or substantially perpendicular.

Figure 5:
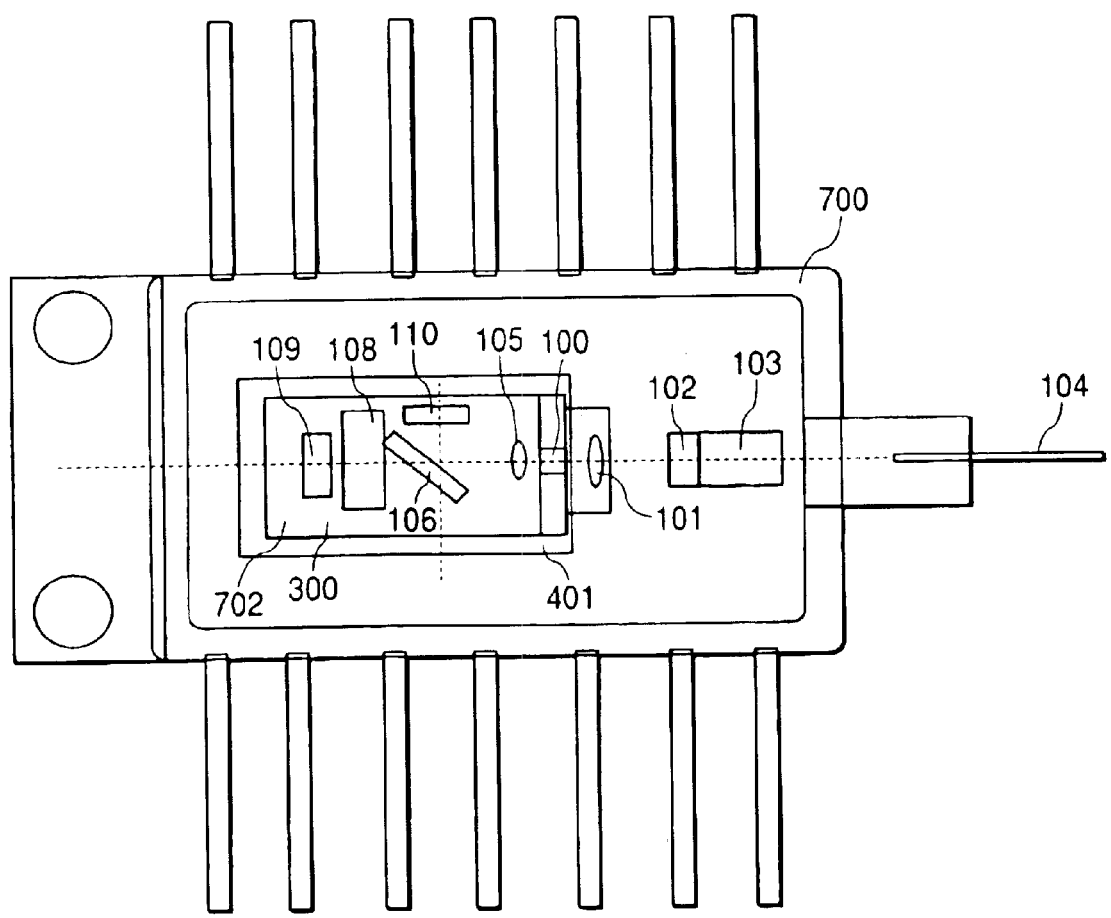
FIG. 5 is a plan view of an optical transmitter module that incorporates a wavelength locker.

The foregoing is the principle of detection on the wavelength error using the etalon. FIG. 5 illustrates an optical transmitter module that is configured on the basis of this principle. FIG. 5 is the plan view of the optical transmitter module.

Figure 4:
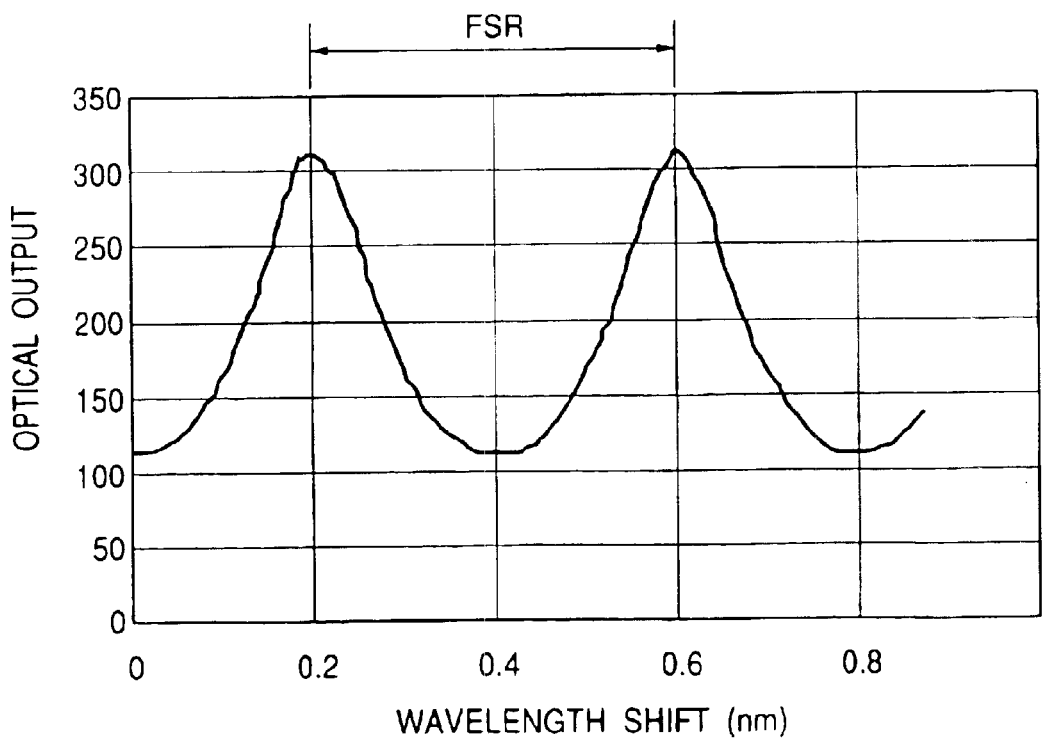
FIG. 4 is a diagram illustrating the wavelength spectral characteristics of the etalon.

The components of this module are contained in a package 700, and necessary terminals 701 are led out. The collimator 101 condenses the light beams radiated forward from the semiconductor laser source 100, and the collimated beams advance through the optical isolator 102 to the focusing lens 103, which focuses the incoming beams to couple with the optical fiber 104. On the other hand, the collimator 105 placed on the back of the laser source 100 condenses the light beams radiated backward from the semiconductor laser source 100, and the beam splitter 106 splits the collimated beams into two. One of the split beams reaches the photo-detector 110, which is served as the monitor output for the light power. The other one passes through the etalon 108 to reach the photo-detector 109, where the wavelength detection curve as shown in FIG. 4 is obtained. FIG. 4 illustrates the wavelength spectral characteristics of the etalon. The horizontal axis represents the wavelength shift, and the vertical axis represents the optical output. FSR denotes its representation. These optical devices are mounted on the stem substrate 300, and the stem substrate 300 is mounted on the thermo-electric cooler 401 (Peltier effect device). The thermo-electric cooler 401 controls the temperature of the devices such as the semiconductor laser to a specific level. Thus, mainly the oscillating wavelength of the semiconductor laser is maintained at a constant.

Here, the etalon 108 should also be controlled at a constant temperature. However, as the ambient temperature of the package 700 varies, the temperature distribution inside the package emerges due to conduction, radiation, and convection of heat. In addition, the temperature of the etalon has been found to vary according to the region thereof. For example, when the etalon is mounted on a substrate, it has been found that a temperature at a position near the mounting portion on the substrate is different from a temperature at a position remote therefrom. In other words, the temperature difference has been found to emerge between the position near the mounting portion of the etalon and the upper portion therefrom. Therefore, the temperature at a position inside the etalon, through which light passes, varies with the ambient temperature of the etalon. On the other hand, the etalon has temperature characteristics, and the transmission wavelength varies according to the next expression. Accordingly, the amount of variation of the transmission peak relative to the temperature variation can be estimated as follows. That is, from the basic expression of the etalon in the case of the vertical incidence based on FIG. 3, the following equation can be obtained.

$$2nt=m\lambda \quad (12)$$

Now, provided that a variation in optical path length due to a temperature rise ΔT is given by δ, and the transmission peak has been attained at a wavelength λ+Δλ, the following expression is met.

$$2(nt\delta)=m(\lambda+\Delta\lambda) \quad (13)$$

On the other hand, by expressing the linear expansion ratio as α (α=dt/dT), and calculating the total differential of the optical path length nt, $$\delta = \left(\left(\frac{dn}{dT}\right)t + n\left(\frac{dt}{dT}\right)\right)\Delta T$$

$$= \left(\left(\frac{dn}{dT}\right) + n\left(\frac{dt}{dT}\right)\right)t\Delta T \quad (14)$$

is obtained. From the expressions (12), (13), and (14), $$\Delta\lambda=(\lambda/n)((dn/dT)+n(dt/dT))\Delta T \quad (15)$$

is obtained. That is, as shown by the expression (15), by substituting [1] for the temperature coefficient (dn/dT) of the refraction factor, and [2] for the product (n (dt/dT)) of the coefficient of linear expansion and the refraction coefficient, the temperature coefficient (Δλ/ΔT) of the transmission wavelength can be expressed by the product of the sum ((dn/dT)+n(dt/dT)) of [1] and [2] and (λ/n). In addition, the temperature coefficient (Δλ/ΔT) of the transmission wavelength does not depend upon the thickness of the etalon. The refraction factor of a synthetic quartz generally used for the material of the etalon is given by the expression (16), from the linear approximation based on the values n=1.444687 (at the wavelength 1500 nm) and n=1.443492 (at the wavelength 1600 nm).

$$n=1.462612-0.01195\lambda \quad (16)$$

Substituting the operation wavelength 1550 nm for λ of the expression (16) will acquire n=1.444. The temperature coefficient of the refraction factor is equal to $8.5\times10^{-2}$. Therefore, the temperature coefficient of the etalon in this case is as follows.

$$\Delta\lambda=0.009\Delta T \text{ nm} \quad (17)$$

Figure 6:
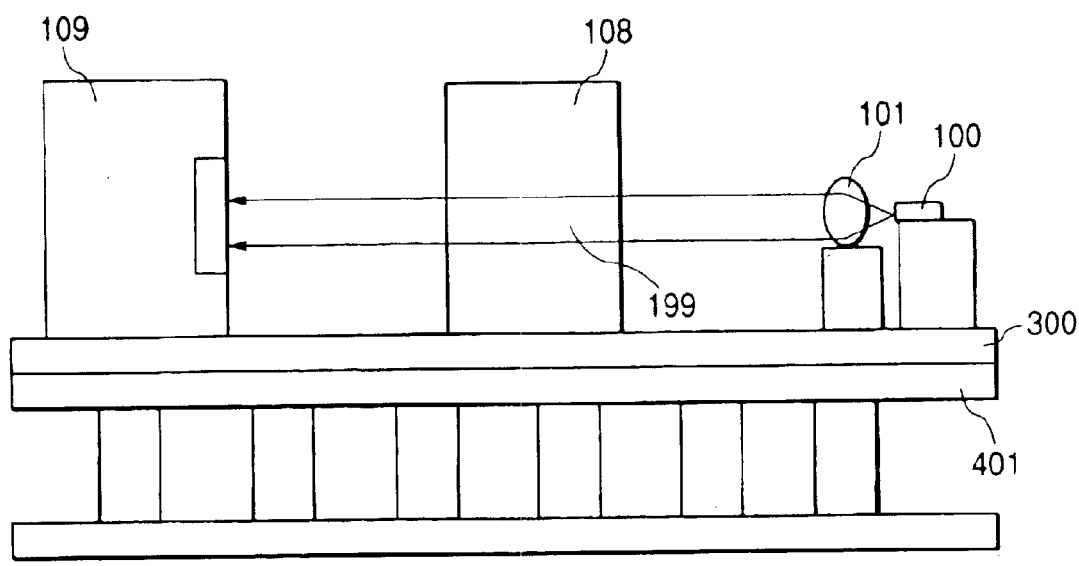
FIG. 6 is a sectional view illustrating a configuration of a conventional optical system for locking a wavelength.

FIG. 6 shows a conventional configuration, in which the contents of the package are illustrated in the side view. The collimator 101 collimates the backward output from the laser source 100, and makes it reach the etalon 108. The photo-detector 109 receives the transmission light. These components are mounted on the stem 300, and are in contact with the thermo-electric cooler (Peltier effect device) 401.

Figure 7:
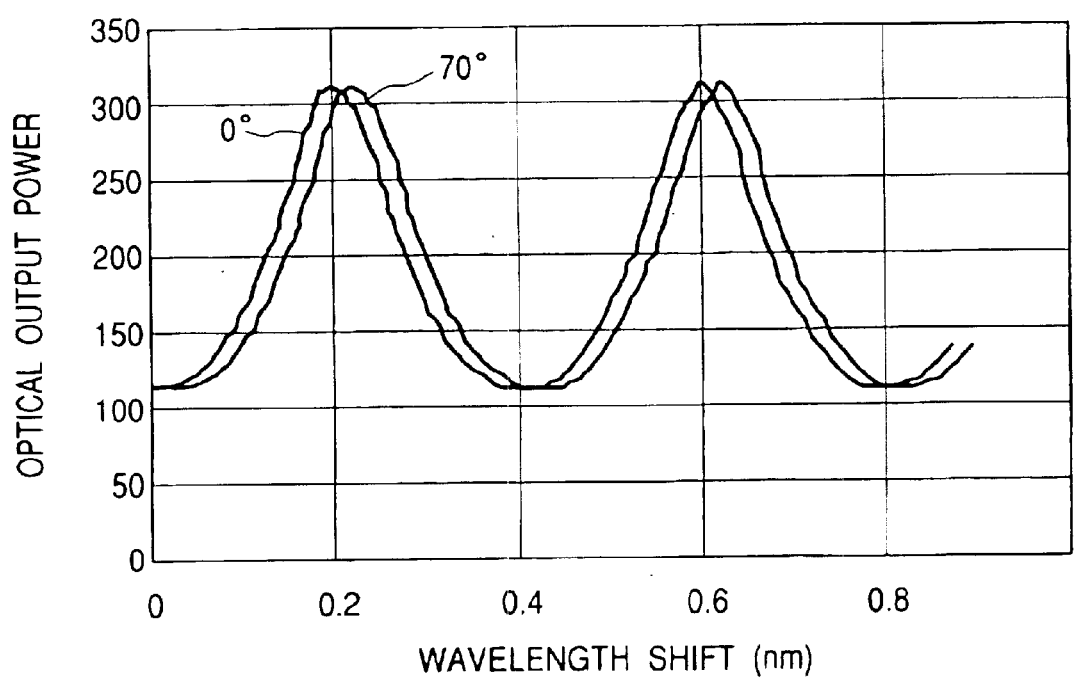
FIG. 7 is a diagram illustrating the transmission characteristics with the ambient temperature varied, in the conventional optical system for locking a wavelength.

When the ambient temperature of the package varies from 0° C. to 70° C., which is specified as the standard environmental temperature for the optical transmitter module, a temperature at a position 199 inside the etalon through which the light passes is acquired by means of a simulation. The result is that when the ambient temperature is 70° C., the temperature is 27.2° C., and when the ambient temperature is 0° C., the temperature is 23.76° C. The temperature difference generated is 3.44° C. This temperature difference is equivalent to 30.96 pm when it is converted into the shift of the transmission wavelength of the etalon by the expression (17). This value 30.96 pm is equivalent to 7.7% of the grid spacing 400 pm, which does not meet the standard requirements for the lock accuracy, which is a problem. FIG. 7 illustrates the shift of the wavelength; and similarly to FIG. 4, it illustrates the wavelength spectral characteristics of the etalon in case of the temperatures 0° C. and 70° C. The horizontal axis represents the wavelength shift, and the vertical axis represents the optical output. To improve the shift of the wavelength spectral characteristics depending on the temperature is the technological object of the embodiment of this invention.

Embodiments of the Invention

Prior to illustration of concrete embodiments, the major embodiments will be enumerated.

The first embodiment of the present invention has been described as above. That is, the construction is made such that part of the outgoing beams from the laser source are made to pass through the etalon as the first light beams to be guided to the first photo-detection means; at least the other part of the outgoing beams are guided to the second photo-detection means as the second light beams without passing through the etalon; and on the basis of the differential signal of the first and second light beams detected by the first and second photo-detection means, the oscillating frequency of the laser source is maintained at a specific value. And, the construction is characterized in that the space where the etalon retains the gas is served as the multiple interference regions. The characteristic points are as follows. The media plate is combined by the two plate materials having the optical characteristics that transmit the light used in the module; the lengths of the two plate materials are set longer than that of the media plate; and the space constituted by both the parts of the two plate materials being not in contact with the media plate is served as the multiple interference regions. That is, the media plate is set not to receive influence by the temperature. More concretely, the media plate is made up with a solid material whose coefficient of thermal expansion is less than $10^{-7}/°$ C. For example, as the solid material is preferred the one being a kind of glass, which has the coefficient of thermal expansion less than $10^{-7}/°$ C. As such, the Zerodure (product name from the Shott Glass Inc.), and the Pylex (product name from the Corning Inc.) are sale on the market.

Here, the lengths of the two plate materials and the length of the media plate signify the length in the direction that intersects the optical axis of the incident light on the etalon. Further usually, the two plate materials and media plate are disposed in the direction that is substantially perpendicular to the optical axis of the incident light.

The two plates are made of the optically polished glass. It is preferable in practice that the plates and the media plate are fixed in the physical contact.

As the configurations in which the media plate is combined with the two plate materials, the following are conceivable. The first one is the so-called cantilever configuration, in which the media plate is disposed only to one ends of the two plate materials, and the other ends of the two plate materials extend outward from one end of the media plate, which is the typical configuration. And, the second one is the so-called inboard beam configuration, in which two media plate members constituting the media plate are disposed to both the ends of the plate materials facing to each other.

Further, the beam splitting means for transmitting part of the outgoing beams from the semiconductor laser source through the etalon as the first light beams and guiding them to the first photo-detection means is a semitransparent beam splitter. The two plate materials having the transparent optical polished plane are structured in the cantilever configuration with the media plate to construct the etalon. Reflection films are formed on the insides of each of the plate materials, and the outsides of each of the plate materials have anti-reflection coatings applied thereon, or take on a structure with a taper.

The plate on the incidence side of the plate materials constituting the etalon can be served as a quarter wavelength plate to control the polarization.

For example, the light beams passing through part of the etalon and the light beams not passing the etalon are obtained by splitting the incident light right and left on a plane virtually parallel to the principal plane of the base to retain the semiconductor laser module, or splitting the incident light up and down on a plane virtually perpendicular to the principal plane of the base to retain the semiconductor laser module. And, one of them is guided to the photo-detector for the wavelength detection, and the other one is served as the reference light.

Further, it is also possible to arrange the etalon to be tilted, to split the light beams into two, to make the first photo-detection means receive one of the two split and make the second photo-detection means receive the other one, and to use the difference of the photocurrents of the photo-detection means as the wavelength error detection signal.

The embodiment of the present invention includes an arrayed light source whereby the semiconductor laser source can emit plural wavelengths. A typical configuration is such that, in the semiconductor laser control module, the semiconductor laser is made up with plural arrayed light sources with different wavelengths, the lights from the plural light sources are combined to form a wave-guiding channel, the outgoing light beams from the wave-guiding channel are condensed by the first condensing lens, the light reflected on the beam splitter is served as the reference light, the transmitted light is split by the second beam splitter, the reflected light is guided to the etalon to detect a wavelength error, the transmitted light is coupled to the optical fiber by the second condensing lens. The embodiment with this configuration can be applied to the semiconductor laser control module, and to other devices and systems.

Figure 8:
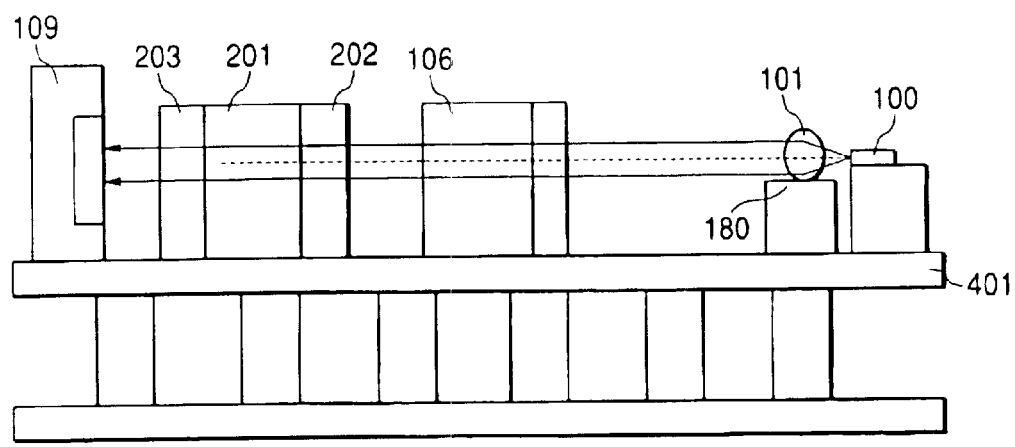
FIG. 8 is a sectional view illustrating a configuration of the optical system for locking a wavelength according to the present invention.

Next, embodiments of the invention will be explained concretely with reference to the drawings. FIGS. 8 and 9 show an embodiment of the invention. FIG. 8 is s side view of a module, and FIG. 9 is a plan view thereof.

Optical components of this module are mounted on the thermo-electric cooler 401. The variable wavelength laser source 100 is mounted on a mount 310, and the collimator 101 is mounted on a silicon substrate 180 or the like. A gas etalon as a typical example of the wavelength-selecting device that is not likely to create shifts in wavelength spectral characteristics depending on a temperature is made up of members indicated by reference numerals 201, 202 and 203. The details of these members will be explained later. The photo-detector 109 as a light-intercepting device is disposed opposite to this wavelength-selecting device. Reference numeral 106 denotes the beam splitter. FIG. 8 is the sectional view, and FIG. 9 is the plan view corresponding to FIG. 8. FIG. 9 also illustrates the optical wave-guiding channel, for example, the optical fiber 104, disposed opposite to the module shown in FIG. 8. The optical isolator 102 is placed facing to the semiconductor laser 101. This serves to prevent a returned light to the semiconductor laser.

Now, the gas etalon as the typical example of the wavelength-selecting device is configured as follows. A solid material 201 with a very low coefficient of linear expansion is selected as a media plate, and the media plate 201 is combined between plates 202 and 203 made of a material to transmit light in an applied wavelength range, thus forming the etalon. Here, as seen in the plan view of FIG. 9, the media plate 201 with a very low coefficient of linear expansion is positioned between one ends of the plates 202 and 203. Light passes through the region where the media plate 201 is not present. This transmission region and the two plate materials construct a function as the etalon. The media plate serves to maintain spacing between the two plates at a specific interval. In the example of FIG. 9, the media plate 201 is disposed only between one ends of the plates 202 and 203; however, the media plate 201 can be disposed between both the ends of the plates 202 and 203. Also, the media plate 201 can be disposed between the central portions of the plates 202 and 203. In this case, both sides of the media plate or one side thereof act as the forgoing space as a part of the etalon. Furthermore, it is necessary to select a length of the plates, by which the spacing between the plates 202 and 203 does not varies or they does not deflect in the region where the media plate 201 is not present. When the spacing varies depending on the position on the plate materials, there is a possibility that the plates cannot assure the function as the etalon. Also, when the plates deflect, the deflection is one form in which the spacing is not maintained at a specific interval, although it depends on the degree of the deflection. When the plates are retained on the media plate in a cantilever manner, it is necessary to examine the problem of deflection. When the plates are structured in an inboard beam, the problem of deflection becomes insignificant in many cases as compared to the case of the cantilever manner. For example, if the lengths of the plates are made sufficiently short, the problem of deflection can be made limited. Also, a configuration of the plate materials with a lower deflection will restrict the influence by the problem of deflection.

Now, the construction of the etalon will be described more concretely.

First, as a material for the media plate 201, the Zerodure (trade name) or the Pylex (trade name), a solid material whose coefficient of thermal expansion is $10^{-7}/°$ C. or less, is prepared. As a material for the plates 202 and 203, a transparent plate material such as quartz glass is selected. In addition, the material for the media plate 201 is combined between the two plate materials 202 and 203 to form the etalon. Here, provided that the thickness of gas appearing between the plates 202 and 203 is given by t, and the film reflection factor of the inside surfaces of the plates 202 and 203 is give by R, the aforementioned expressions (1) through (11) can be applied, so that FSR and finesse can be set and the optimum wavelength detection filter can be designed. Alternatively, on the inside surfaces of the plates 202 and 203 may be formed films having a desired reflection factor R.

As a gas to fill the space, air or nitrogen gas or the like may be employed. In this case, $(dn/dT) \approx 0$ and $(dt/dT) \approx 0$ are met; accordingly, $\Delta\lambda \approx 0$ is deduced from the expression (15). Therefore, even if the ambient temperature varies, the shift value of a possible selected transmission wavelength can be made sufficiently low to an ignorable degree. The etalon is preferably mounted in a sealed package. In addition, a non-reflection coating or a tapering should be applied to the outsides of the plates 202 and 203 so as to remove the influence of ghost reflection. The media plate 201 is mounted only on one sides of the plates 202 and 203, that is, only one media plate is used in this case. Accordingly, this structure eliminates the inclinations of the plates 202 and 203, which are created when two media plates are mounted on both sides of the two plates. This involves a reduction in the number of components, which contributes to a cost reduction. The mating faces of the media plate 201 and the plates 202 and 203 are optically polished so that the surface roughness thereof becomes less than some fractions of the wavelength of the light signal. This makes bonding of the media plate and the plates possible using the so-called physical contact. Or, this makes the bonding possible using soldering, YAG welding, and Ultra-Violet adhesive resin and so forth instead of the use of the physical contact.

Figure 10:
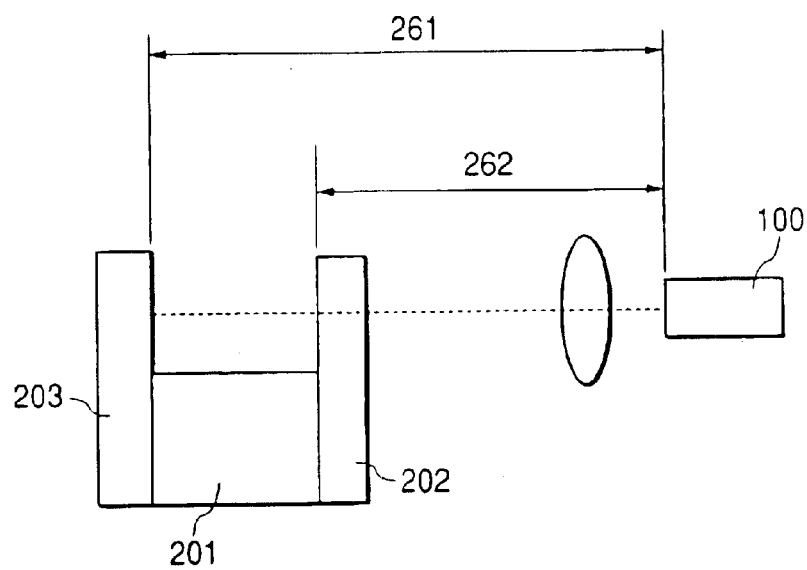
FIG. 10 is a sectional view illustrating a principal part of the configuration of the optical system for locking a wavelength according to the embodiment of the present invention.

FIG. 10 illustrates a principal part of the embodiment, in which the transparent material 203 is also used as the wavelength plate. In this case, of the plates constituting the etalon, at least the plate placed on the side of the semiconductor laser 100 is a quarter wavelength plate. This configuration permits polarization control by the plate. This will reduce undesired resonance generated in the optical system.

More specifically, a resonator 262 is formed between the end face of the semiconductor laser 100 and the inside of the transparent plate 202, or a resonator 261 is formed between the end face of the semiconductor laser 100 and the inside of the transparent plate 203. Accordingly, if the oscillating wavelength of the semiconductor laser varies, ripples will be created on the photocurrent of the photo-detector 110, which is a problem. This phenomenon results from the mutual interference of light reflected from each of the faces.

For this reason, the plate 202 is formed into a quarter wavelength plate, and the linearly polarized light from the semiconductor laser 100 is made to pass through the quarter wavelength plate, which is transformed into circularly polarized light. In addition, the reflected light on the plate 203 again passes through the plate 202, which is transformed into the perpendicularly polarized light from the original linearly polarized light. Thus, the polarizations of both are perpendicular; the interferences will not be created accordingly, and the optical output power is maintained at a substantially constant level, thereby reducing the foregoing ripples.

Figure 11:
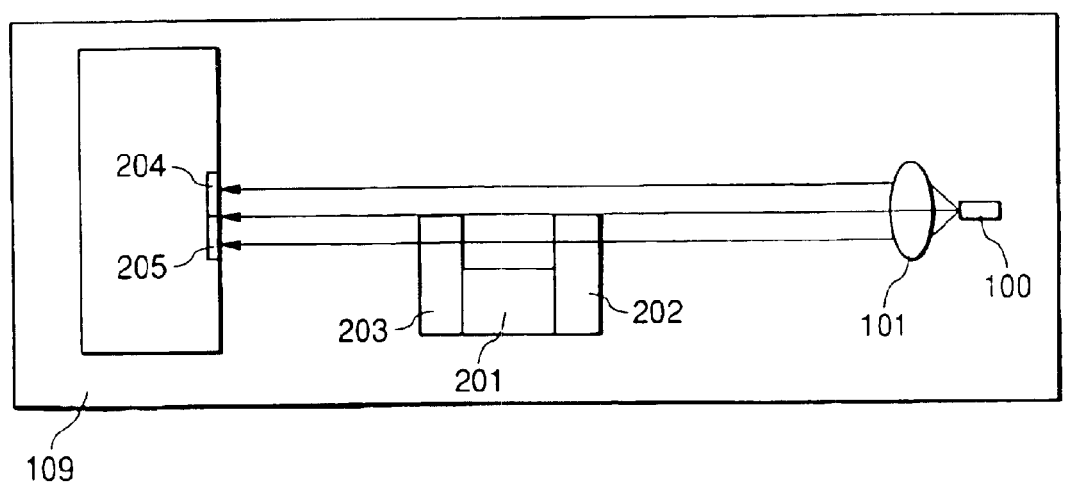
FIG. 11 is a plan view illustrating the principal part of the configuration of the optical system for locking a wavelength according to the embodiment of the present invention.

FIG. 11 illustrates a configuration of the gas etalon made up of the media plate 201 and the plates 202 and 203 according to the embodiment of the present invention, in which the etalon is used as the wavelength error detection filter for locking the wavelength. FIG. 11 illustrates a plane configuration of the major part. That is, the light beams from the semiconductor laser 100 are collimated by the condensing lend 101. This ray bundle is laterally divided into two parts ideologically. One of the parts of the ray bundle is directed to reach a photo-detector 204 that gives the photocurrent signal Pm in the aforementioned expressions (7) and (8). The other passes through the gas etalon to reach a photo-detector 205 that gives the photocurrent signal Pt to originate the wavelength error detection signal $A(\lambda)$. The operation after attaining the wavelength error detection signal $A(\lambda)$ is the same as the aforementioned. This embodiment permits the optical system illustrated in FIG. 11 to attain a signal for the wavelength error detection.

Figure 12:
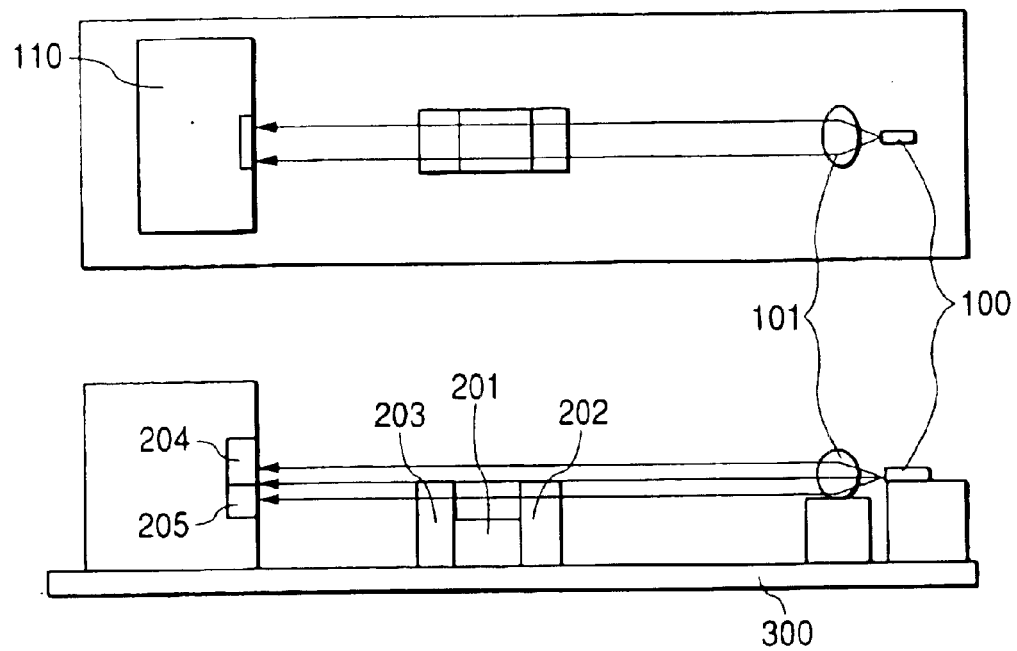
FIG. 12 is a diagram illustrating a principal part of another configuration of the optical system for locking a wavelength according to the embodiment of the present invention.

FIG. 12 illustrates another configuration of the gas etalon made up of the media plate 201 and the plates 202 and 203, in which the etalon is used as the wavelength error detection filter for locking the wavelength. FIG. 12A is a plan view of the major part of this embodiment, and FIG. 12B is a sectional view thereof. In the figures, the same portions as in the foregoing embodiment are given the same reference numerals. The collimated light beams from the condensing lens 101 are longitudinally split into two parts ideologically. One of the parts of the ray bundle is directed to reach the photo-detector 204 that gives the photocurrent signal Pm in the expressions (7) and (8). The other one of the light beams passes through the gas etalon to reach the photo-detector 205 that gives the photocurrent signal Pt to originate the wavelength error detection signal A(λ). In the embodiment of FIG. 11, the light beams are split on a plane parallel to the substrate; however in this embodiment, the light beams are longitudinally split on a plane perpendicular to the substrate. It is essential to dispose the laser, etalon, photo-detectors, and so forth, in such a manner that part of the ray bundle passes through the etalon, and at least part of the remaining ray bundle does not pass through the etalon.

Figure 13:
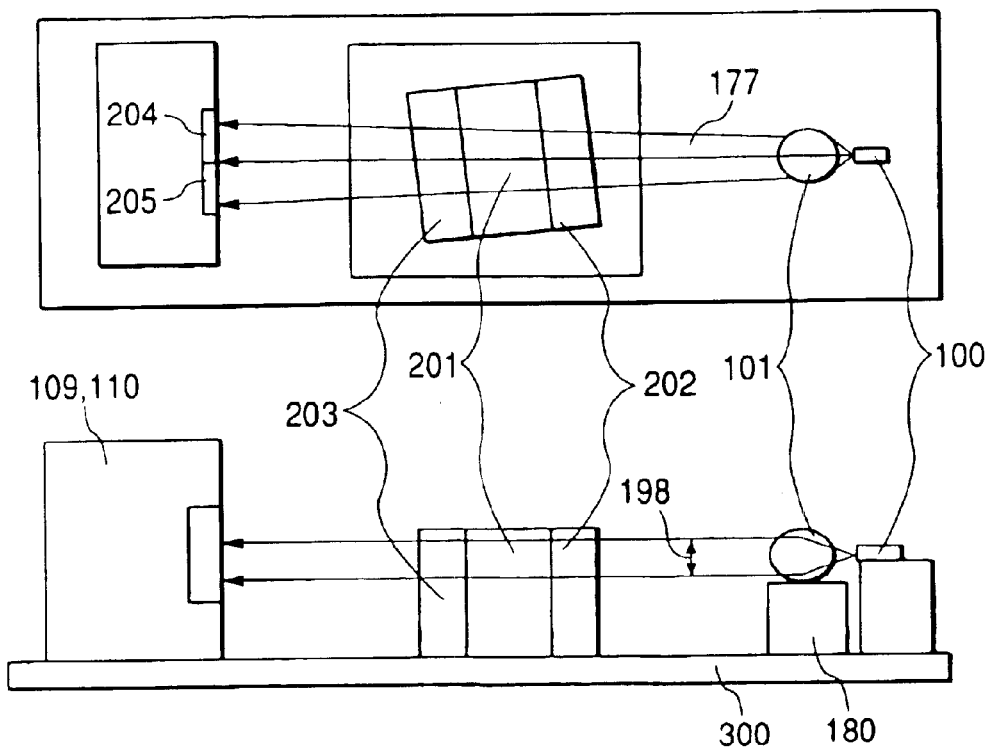
FIG. 13 is a diagram illustrating another configuration of the optical system for locking a wavelength according to the embodiment of the present invention.

FIG. 13 illustrates another embodiment of the present invention. In this embodiment, the gas etalon is arranged slant to the optical axis of the laser beams. FIG. 13A is a plan view of the major part of this example, and FIG. 13B is a sectional view thereof. In the figures, the same portions as in the foregoing embodiments are given the same reference numerals.

A lens 101 condenses divergent light beams from the semiconductor laser 100 into slightly divergent light beams 177. In addition, the gas etalon (201, 202 and 203) according to the invention is laid out slightly tilted to the central optical axis of the beams 177. Thus, the beams that reach the two photo-detectors arranged adjacently laterally are made to each pass through the etalon with different optical path lengths. With this configuration, the wavelength response of the two photo-detectors 204 and 205 are slightly shifted on the wavelength axis as shown in FIG. 4. Therefore, to obtain the difference of the outputs from the two photo-detectors 204, 205 will attain the wavelength error signal. In this type of wavelength error detection optical system, the temperature dependence of the gas etalon that functions as the wavelength error detection filter is almost ignorable; therefore, if the ambient temperature of the whole package varies, the influence will be reduced.

Figure 14:
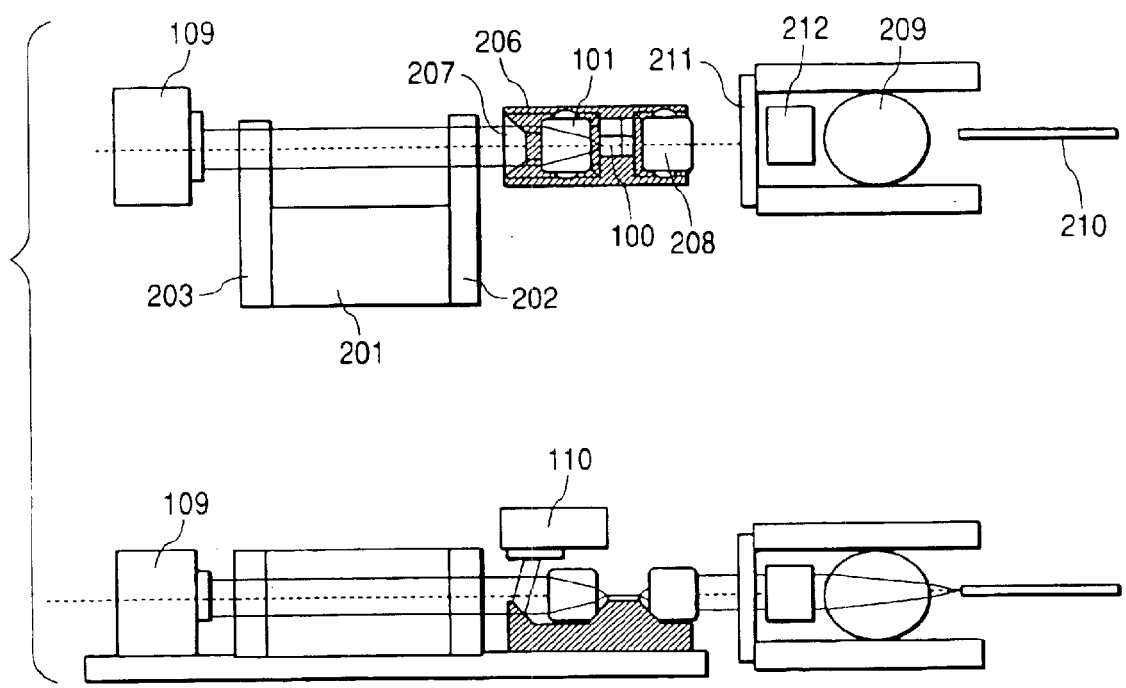
FIG. 14 is a diagram illustrating the principal part of another configuration of the optical system for locking a wavelength according to the embodiment of the present invention.

FIG. 14 illustrates a wavelength locking optical system according to another embodiment of the present invention. This embodiment provides a configuration to attain more easily the light for acquiring the photocurrent Pm. That is, a reflection mirror is attached to a portion of the retaining substrate for introducing the light to the etalon, thereby reducing the number of the components or saving the space. The retaining substrate with such a reflection mirror is formed with a silicon substrate. A mirror surface tilted to the light beams can be formed precisely and easily by the so-called anisotropic etching utilizing the anisotropy of the crystal lattice of the silicon. FIG. 14A is a plan view of this embodiment, and FIG. 14B is a side view thereof.

The condensing lens 101 condenses the light beams from the semiconductor laser 100 into collimated beams, which are directed to the gas etalon made up of the media plate 201 and the plates 202 and 203. In this embodiment, both the semiconductor laser 100 and the condensing lens 101 are mounted on a silicon substrate 206. This silicon substrate 206 has a V-shaped groove thereon formed by the anisotropic etching. The etching is performed to make the bottom of the V-shaped groove into a plane. More precisely, the sectional shape of this groove is not V-shaped. As shown in FIG. 14, the sectional shape has two facing sides and a plane connecting the two sides. The condensing lens 101 is mounted on the bottom of this V-shaped groove. One of the tilted surfaces of the V-shaped groove is served as the reflection mirror. The semiconductor laser 100 is mounted on the top of a hill-shaped region of the silicon substrate 206. A reflection mirror 207 formed on the substrate 206 reflects part of the light beams condensed by the condensing lens 101. This reflection will divide the light beams condensed by the condensing lens 101. The photo-detector 110 photo-electrically transforms the reflected light into the photocurrent Pm. The light passing through without being reflected will pass through the gas etalon to reach the photo-detector 109. The photo-detector 109 photo-electrically transforms this light into the photocurrent Pt.

Figure 15:
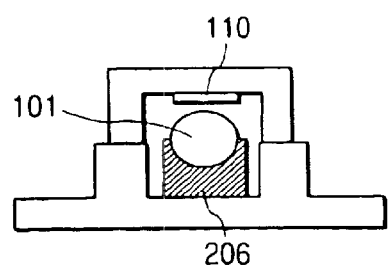
FIG. 15 is a sectional view of a light interceptor holder of the optical system for locking a wavelength according to the embodiment of the present invention.

With the silicon substrate thus devised, the beam splitter 106 illustrated in FIG. 1 becomes unnecessary, which makes it possible to realize not only reducing the number of components, but also enhancing the integration by the space saving. Furthermore, the light source and the condensing lens are mounted on the same silicon substrate; accordingly, the module becomes insensitive to the impact of thermal expansion with the temperature variation. Therefore, the position of the condensing lens relative to the light source does not substantially changes, and the variations in the incident angle on the etalon can be reduced accordingly. Another condensing lens 208 condenses the light beams radiated on the front of the semiconductor laser 100 into parallel or convergent light beams. In the case of parallel light beams, another condensing lens 209 of a ball lens or the like couples the beams to an optical fiber 210. Between the condensing lens 208 and the other condensing lens 209 are arranged a sealing window 211 and an optical isolator 212. FIG. 15 is a sectional view of a holder 301 for the photo-detector 110 that receives the light beams reflected upward by the silicon mirror. The section intersects the optical axis of the condensing lens. The holder 301 is mounted on the stem 300. The holder 301 is formed in a shape of a bridge to straddle the silicon substrate 206 that mounts the semiconductor laser 100 and the condensing lens 101 and so forth, thereby adjusting the height.

Furthermore, the mounting of the semiconductor laser on a substrate separate from the silicon substrate, for example, a Covar substrate makes it possible to take countermeasures against radio frequency noises. In this case, naturally the condensing lens 208 and the photo-detector 110 can be mounted on the silicon substrate, and the foregoing reflection mirror can be applied to the silicon substrate.

Figure 16:
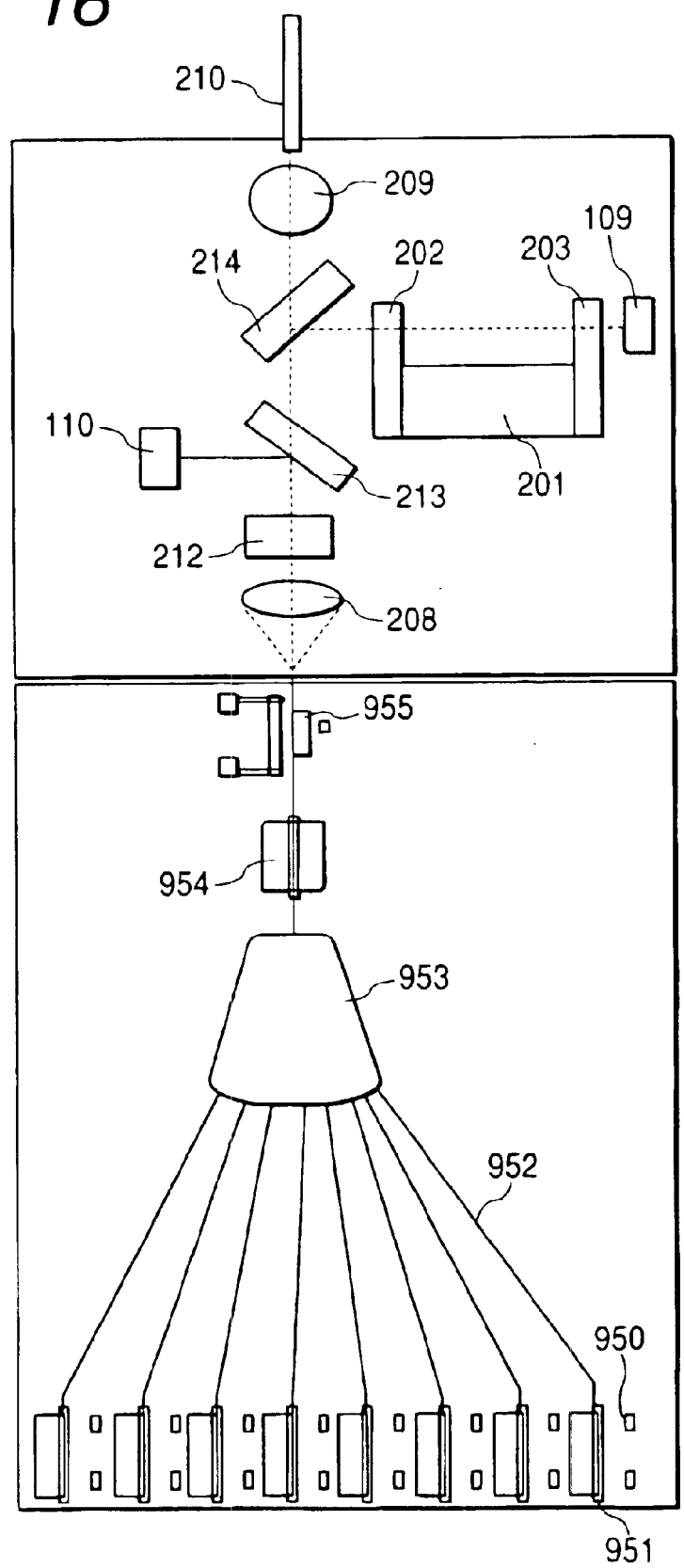
FIG. 16 is a plan view illustrating a configuration of the optical system for locking a wavelength for wavelength division multiplexed lights, according to the embodiment of the present invention.

FIG. 16 illustrates a configuration wherein the light radiated on the front of the semiconductor laser 100 is used for the wavelength error detection signal. Furthermore, this embodiment employs multi-channel light sources.

An optical wave-guide 952 guides each of the light power outputs from a semiconductor laser array 951 wherein semiconductor laser devices each having different oscillating wavelengths are arrayed in a line to a wavelength multiplexer 953 that multiplexes the different wavelengths and outputs the multiplexed output to a single mode waveguide. Then, an optical amplifier 954 amplifies the multiplexed light, which is guided to an optical modulator 955. The condensing lens 208 condenses the light beams outputted from the optical modulator 955, which are guided to the beam splitter 213 by way of the optical isolator 212. The photo-detector 110 receives the light beams reflected on the beam splitter 213, and produces the photocurrent Pm. In replacement of the beam splitter 213, the silicon mirror 207 of this invention can be formed on the front for use. On the other hand, the light beams passing the beam splitter 213 are split into two by a second beam splitter 214. The reflected light beams here pass through the gas etalon (media plate 201, plates 202 and 203), and reach the photo-detector 109. Then, the photo-detector 109 photo-electrically transforms the light beams into the photocurrent Pt. The light beams passing through the second beam splitter 214 passes through the second condensing lens 209, and reach the optical fiber 210.

Figure 17:
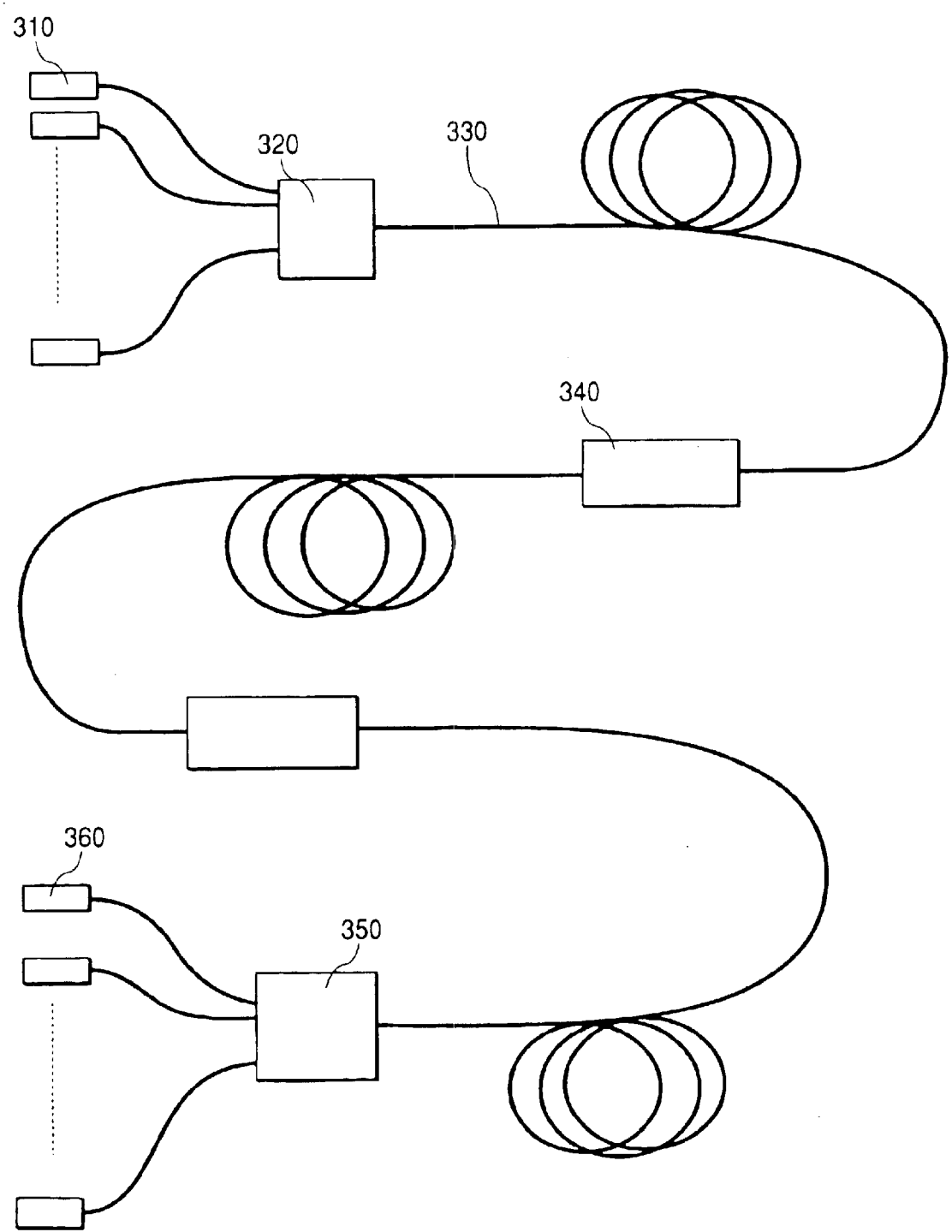
FIG. 17 is a diagram illustrating a wavelength division multiplexed communication system to which a transmitter module according to the embodiment of the present invention is applied.

FIG. 17 illustrates a configuration of another embodiment according to the invention, namely, a basic configuration for implementing a wavelength division multiplexed communication.

Optical transmitter modules 310 according to the invention are prepared each for the channels of the ITU-T grid wavelengths, and a great number of them are arrayed in multiple. These lights are joined to a wavelength multiplexer 320, and joined light passes through one optical fiber 330. The light signal transmitted in this state is multiplexed in terms of the wavelength. Each of the wavelength division multiplexed lights carries a signal, and is transmitted the optical fiber over a long distance. When the light signal transmits about 600 km, for example, the light signal attenuates due to the loss of the optical fiber. Accordingly, a repeater 340 with an optical fiber amplifier becomes necessary. As the optical fiber amplifier, an EDFA (Erbium Doped Fiber Amplifier), for example, is widespread, which collectively amplifies the channel signals in the so-called c-band.

In this band, the wavelength is about 32 nm. In case of the wavelength spacing being 0.8 nm, the band can accommodate 40 channels, and in case of 0.4 nm, the band can accommodate 80 channels. A demultiplexer 350 demultiplexes the light signals passing through several repeaters each for the spectral wavelengths, which are converted into electric signals each for the channels by receiver modules 360. In such a large capacity wavelength division multiplexed communication, the stabilized wavelength locking mechanism having been described in detail so far fulfils an important role with regard to the light source, in order to remove the crosstalk between the channels.

As the aspects of the invention have been descried, the construction composed of the basic components permits optically electrically stabilized wavelength locking against the variations of ambient temperature of the etalon, and the performance of the etalon can be utilized at its maximum. That is, from the viewpoints of resolution of wavelength selection, coefficient of utilization of light, enhancement of packaging density of the etalon inside the laser source module, mechanical stability of the etalon, compensation of locked wavelength shift against temperature variation of the etalon, and so forth, it is possible to solve the technical subjects that have been impossible to solve so far, especially the problem of locked wavelength shift of the etalon by the temperature variation. Moreover, to utilize the wavelength control system according to the invention will lock the oscillating wavelength of a semiconductor laser with a higher accuracy than the conventional. Furthermore, to vary the temperature of a semiconductor laser will make it possible to shift the oscillating wavelength of a semiconductor laser to an arbitrary ITU-TS grid, and to lock the wavelength at the same time. Furthermore, the embodiment according to the invention will provide a laser source essential to the wavelength division multiplexed communication apparatus, or the router for wavelength channels.

According to the embodiment of the invention, since the temperature dependence of a wavelength error detection device can be ignored, even if there is a temperature variation in the wavelength locking optical system, it is possible to reduce the shift from the target locking range of a wavelength locker.

According to the embodiment of the invention, it is possible to reduce the influences of the ambient temperature, etc., as much as possible, and to provide a semiconductor laser control module with the oscillating wavelength stabilized. Furthermore, the embodiment of the invention will provide an applied system, optical system, using the semiconductor laser control module that has the influences of the ambient temperature, etc., reduced as much as possible and the oscillating wavelength stabilized.

According to the embodiment of the invention, the wavelength of a semiconductor laser can be stabilized.

What is claimed is:

1. An optical transmitter module, comprising:

a laser source to output outgoing light;

an etalon positioned to pass part of the outgoing light from the laser source therethrough;

a first photo detector positioned to receive the part of the outgoing light passed through the etalon, to produce a first detection signal;

a second photo detector positioned to receive another part of the outgoing light not passed through the etalon, to produce a second detection signal;

a laser source driver circuit to receive and compare the first detection signal and second detection signal, and to drive and control the laser source to substantially a specific oscillating frequency using feedback based at least in part on a differential between the first detection signal and second detection signal;

wherein the etalon includes two plates that sandwich at least one media plate therebetween, and each plate has an optical characteristic allowing transmission of the part of the outgoing light therethrough;

wherein the etalon has a construction where:

one end of each plate is fixed to the at least one media plate, and the other end extends from the at least one media plate to form a cantilever structure, or a center portion of each plate is fixed to the at least one media plate, and other portions of the plate extend from the at least one media plate to form a cantilever structure, or the at least one media plate includes first and second media plates, in which one end of each plate is fixed to the first media plate, and the other end of each plate is fixed to the second media plate, whereby the plates and the first and second media plates form an inboard beam structure;

wherein a space between the two plates not having the at least one media plate therebetween, serves as a multiple interference region of the etalon; and wherein each media plate of the at least one media plate is a solid material whose coefficient of thermal expansion is 10–7/° C. or less.

2. An optical transmitter module according to claim 1, wherein the two plates are optical polished plates.

3. An optical transmitter module according to claim 1, comprising a semitransparent beam splitter positioned in a path of the outgoing light from the laser source to direct the part of the outgoing light toward the etalon, and to direct the another part of the outgoing light toward the second photo detector.

4. An optical transmitter module according to claim 1, wherein either inwardly-facing side of the two plates surrounding the space serving as the multiple interference region has a reflection film thereon, and either outwardly-facing side of the two plates has a substantially non-reflective film, or is a tilted surface with respect to an optical axis of the part of the outgoing light.

5. An optical transmitter module according to claim 1, wherein the plate on the incident side of the part of the outgoing light, is a quarter wavelength plate.

6. An optical transmitter module according to claim 1, comprising a condenser to condense the outgoing light from the semiconductor laser source into a condensed light, wherein the etalon has a tilted posture in the condensed light, the condensed light having passed through the etalon is split into two, where a first split light is received by the first photodetector, and a second split light is received by the second photodetector, and the difference of photocurrents of the first and second photodetectors serves as a wavelength error detection signal.

7. An optical transmitter module according to claim 1, wherein:
the laser source is mounted on a silicon substrate,
the silicon substrate has a reflection surface tilted to the optical axis of the outgoing light, to reflect the another part of the outgoing light to the second photo detector.

8. An optical transmitter module according to claim 7, wherein at least the laser source and a condensing lens are mounted on the silicon substrate, the reflection surface to reflect the another part of the outgoing light coming from the condensing lens to the second photo detector, and the part of the outgoing light not impinging on the reflection surface passing to the etalon.

9. An optical transmitter module according to claim 7, wherein the tilted surface is an etched surface that was formed by means of anisotropic etching with respect to a crystallinity of the silicon substrate.

10. The communication system according to claim 7, wherein the tilted surface is an etched surface that was formed by means of anisotropic etching with respect to a crystallinity of the silicon substrate.

11. An optical transmitter module according to claim 1, wherein the laser source has a light emitting part to output plural light beams of differing wavelengths, and wherein the optical transmitter module comprising a light joiner to join the plural light beams emitted from the light emitting part into a joined outgoing light to act as the outgoing light,
where the etalon positioned to pass part of the joined outgoing light from the laser source therethrough;
the first photo detector positioned to receive the part of the joined outgoing light passed through the etalon, to produce the first detection signal;
the second photo detector positioned to receive the another part of the joined outgoing light not passed through the etalon, to produce the second detection signal; and
the laser source driver circuit to receive and compare the first detection signal and second detection signal, and to drive and control the laser source to substantially a specific oscillating frequency using feedback based at least in part on the differential between the first detection signal and second detection signal.

12. A communication system comprising:
at least one input/output unit; and
an optical transmitter module including:
a laser source to output outgoing light;
an etalon positioned to pass part of the outgoing light from the laser source therethrough;
a first photo detector positioned to receive the part of the outgoing light passed through the etalon, to produce a first detection signal;
a second photo detector positioned to receive another part of the outgoing light not passed through the etalon, to produce a second detection signal;
a laser source driver circuit to receive and compare the first detection signal and second detection signal, and to drive and control the laser source to substantially a specific oscillating frequency using feedback based at least in part on a differential between the first detection signal and second detection signal;
wherein the etalon includes two plates that sandwich at least one media plate therebetween, and each plate has an optical characteristic allowing transmission of the part of the outgoing light therethrough;

wherein the etalon has a construction where:
one end of each plate is fixed to the at least one media plate, and the other end extends from the at least one media plate to form a cantilever structure, or
a center portion of each plate is fixed to the at least one media plate, and other portions of the plate extend from the at least one media plate to form a cantilever structure, or
the at least one media plate includes first and second media plates, in which one end of each plate is fixed to the first media plate, and the other end of each plate is fixed to the second media plate, whereby the plates and the first and second media plates form an inboard beam structure;
wherein a space between the two plates not having the at least one media plate therebetween, serves as a multiple interference region of the etalon; and
wherein each media plate of the at least one media plate is a solid material whose coefficient of thermal expansion is $10$–$7/^\circ$ C. or less.

13. A communication system according to claim 12, wherein the two plates are optical polished plates.

14. A communication system according to claim 12, comprising a semitransparent beam splitter positioned in a path of the outgoing light from the laser source to direct the part of the outgoing light toward the etalon, and to direct the another part of the outgoing light toward the second photo detector.

15. A communication system according to claim 12, wherein either inwardly-facing side of the two plates surrounding the space serving as the multiple interference region has a reflection film thereon, and
either outwardly-facing side of the two plates has a substantially non-reflective film, or is a tilted surface with respect to an optical axis of the part of the outgoing light.

16. A communication system according to claim 12, wherein the plate on the incident side of the part of the outgoing light, is a quarter wavelength plate.

17. A communication system according to ciaim 12, comprising a condenser to condense the outgoing light from the semiconductor laser source into a condensed light, wherein the etalon has a tilted posture in the condensed light, the condensed light having passed through the etalon is spilt into two, whore a first spilt light is received by the first photodetector, and a second split light is received by the second photodetector, and the difference of photocurrents of the first and second photodetectors serves as a wavelength error detection signal.

18. A communication system according to claim 12, wherein:
the laser source is mounted on a silicon substrate,
the silicon substrate has a reflection surface tilted to the optical axis of the outgoing light, to reflect the another part of the outgoing light to the second photo detector.

19. A communication system according to claim 18, wherein at least the laser source and a condensing lens are mounted on the silicon substrate, the reflection surface to reflect the another part of the outgoing light coming from the condensing lens to the second photo detector, and the part of the outgoing light not impinging on the reflection surface passing to the etalon.

20. A communication system according to claim 12, wherein the laser source has a light emitting part to output plural light beams of differing wavelengths, and wherein the optical transmitter module comprising a light joiner to join the plural light beams emitted from the light emitting part into a joined outgoing light to act as the outgoing light, where the etalon positioned to pass part of the joined outgoing light from the laser source therethrough;

the first photo detector positioned to receive the part of the joined outgoing light passed through the etalon, to produce the first detection signal;

the second photo detector positioned to receive the another part of the joined outgoing light not passed through the etalon, to produce the second detection signal; and the laser source driver circuit to receive and compare the first detection signal and second detection signal, and to drive and control the laser source to substantially a specific oscillating frequency using feedback based at least in part on the differential between the first detection signal and second detection signal.

* * * * *